United States Patent [19]
Nakatani

[11] Patent Number: 5,888,627
[45] Date of Patent: Mar. 30, 1999

[54] PRINTED CIRCUIT BOARD AND METHOD FOR THE MANUFACTURE OF SAME

[75] Inventor: Seiichi Nakatani, Hirakata, Japan

[73] Assignee: Matsushita Electric Industrial Co., Ltd., Japan

[21] Appl. No.: 865,055

[22] Filed: May 29, 1997

[30] Foreign Application Priority Data

May 29, 1996 [JP] Japan ..................................... 8-134023

[51] Int. Cl.⁶ .............................. B32B 9/00; B32B 31/20; H05K 3/02; H05K 3/46
[52] U.S. Cl. .................. 428/209; 428/304.3; 428/321.3; 428/901; 29/829; 29/830; 29/835; 29/837; 29/841; 29/845; 29/852; 361/748; 361/749; 361/751; 361/760; 361/803; 174/264
[58] Field of Search .............................. 29/829, 830, 835, 29/837, 841, 845, 852; 361/748, 749, 751, 760, 803; 428/209, 304.4, 321.3, 901; 174/264

[56] References Cited

U.S. PATENT DOCUMENTS

| | | | |
|---|---|---|---|
| 4,910,077 | 3/1990 | Benedikt | 428/251 |
| 5,269,863 | 12/1993 | Middelman | 156/177 |
| 5,346,750 | 9/1994 | Hatakeyama et al. | 428/209 |

FOREIGN PATENT DOCUMENTS

| | | |
|---|---|---|
| 3-155190 | 7/1991 | Japan . |
| 3-250648 | 11/1991 | Japan . |
| 7-336051 | 12/1995 | Japan . |

OTHER PUBLICATIONS

Derwent Abstracts 86–186071, "Metal Clad Laminated Sheet Prodn.", Jun. 1986.

*Primary Examiner*—Frederick Krass
*Attorney, Agent, or Firm*—Parkhurst & Wendel

[57] ABSTRACT

It is an object of the present invention to provide a highly reliable printed circuit board subject to little bowing or twisting of the substrate, wherein the substrate and metal wiring are securely bonded together, and stable electrical and mechanical connection is achieved between the metal wiring and electroconductive resin paste filled into the through holes, and to provide a method of manufacture for same. The present invention relates to a printed circuit board having a multilayer wiring structure comprising a plurality of sheet substrates consisting of resin component layers containing an inorganic filler formed onto both sides of an organic nonwoven fabric material, and two or more circuit patterns, wherein through holes are formed in the sheet substrates in the thickness direction thereof and an electroconductive resin component is filled into the through holes, forming electrical connection between each of the electrode layers, and to a method of manufacture for same.

31 Claims, 4 Drawing Sheets

PRINTED CIRCUIT BOARD AND METHOD FOR THE MANUFACTURE OF SAME

BACKGROUND OF THE INVENTION

1. Field of the Invention

The present invention relates to a printed circuit board onto the principal surface of which electronic components such as LSI circuits, passive components, or the like, are mounted, which comprises an electrical wiring layer for providing electrical connection between these components, and to a method for the manufacture of same.

2. Description of the Related Art

In recent years, it has been sought to reduce the size and weight of electronic devices and to achieve further functional improvements therein. Therefore, higher density and higher functionality is demanded in semiconductors and printed circuit boards (PCB's) which form the constituent elements of the related electronic circuits.

For example, in semiconductors, pin pitches are becoming narrower and the number of pins is continually being increased, in order to increase integration and functionality. At present, terminal pitches have been reduced to 0.3 mm. If the pitch is reduced further than this and the number of pins is further increased, then it becomes difficult to mount components by means of conventional mounting methods using solder, and therefore COB technology whereby semiconductors are mounted directly onto a substrate without using packages, is considered to be important for the future. Therefore, in recent years, the development of COB technology has been investigated on all fronts.

On the other hand, the substrates that are most commonly known for use in PCB's allowing high-density component configuration are glass-epoxy PCB's. These use glass fiber cloth impregnated with a heat-resistant epoxy resin to form an insulating substrate material.

Glass-epoxy multilayer PCB's, which are of a type of glass-epoxy PCB, are widely used in consumer applications at the present time. However, these cannot be regarded as sufficient to meet the future demands for increased component density described above. The reasons for this are as follows.

When arranging high density wiring, since through holes obstruct the wiring spaces in the substrate, it becomes necessary to take the wiring by a roundabout route, and as a result, the length of the wiring is increased. Since there is little space for the wiring, it is also difficult to apply automatic wiring using CAD techniques. Moreover, in the future, through holes of even smaller diameter will be difficult to form by drilling and the cost ratio required for drilling will be higher than it is at present.

Furthermore, the process of forming electrode layers using copper plating, which is required in through hole manufacture, creates environmental pollution and is therefore undesirable. In addition, components cannot be mounted at the regions where through holes are formed. These problems apply both to multilayer boards and to double-sided boards formed by electrically connecting the upper and lower sides of a simple insulating layer by means of through holes.

Figure 4:
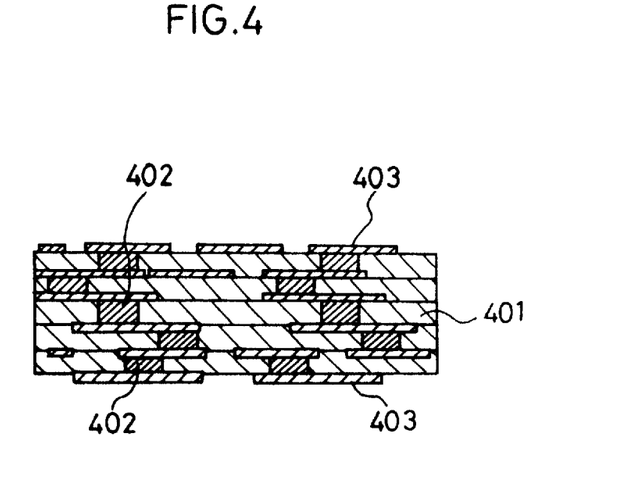
FIG. 4 is a sectional view illustrating the composition of a conventional multilayer PCB wherein organic nonwoven fabric is used as an reinforcing agent.

In view of these problems, new configurations for PCB's which allow high-density mounting of components have already been proposed (U.S. Pat. No. 5,346,750). FIG. 4 shows a conceptual view of a cross-section of such a PCB. Rather than a glass-epoxy PCB, this method uses a sheet substrate material 401 formed by impregnating an organic nonwoven fabric with a thermosetting resin. In this method, through holes are formed in the substrate material 401 by laser processing, and these through holes are filled with an electroconductive resin paste 402. Copper foil 403 is then applied to the upper and lower surfaces of the substrate material, and it is subjected to compression curing by heating and pressurization, whereupon the copper is patterned to yield a double-sided PCB. A multilayer PCB can be obtained by bonding layers of the aforementioned sheet substrate material, wherein through holes are formed into which electroconductive paste is filled, and layers of the aforementioned copper foil, onto this double-sided PCB.

In a PCB of this composition, it is possible to create buried via hole connection at desired positions between desired layers. Thereby, high-density wiring and component mounting can be achieved.

However, since the conventional composition described above uses a substrate material comprising organic nonwoven fabric, there is poor adhesion between the substrate material and the copper foil, and hence there is a problem in that it is impossible to maintain a high strength in the mounting of components, when components are soldered onto the finished PCB.

This is because, in a substrate material using glass fibers as a reinforcing material, a layer consisting only of impregnating resin exists between the substrate material and the copper foil, whereas in a substrate material using organic nonwoven fabric as a reinforcing material, there are nonwoven fabric fibers between the substrate material and the copper foil, and hence there is a lower proportion of impregnating resin (thermosetting resin) present.

The nonwoven fabric fibers present between this substrate material and the copper foil do not contribute to the curing and condensation of the substrate material between the substrate and the copper foil when the substrate material is hardened using a thermal press.

Furthermore, the impregnating resin (thermosetting resin) in the substrate material may flow in between the electroconductive resin paste and the copper foil, causing a barrier and producing connection faults. An additional problem is that the existence of such a barrier may cause damage to occur at the interconnection between the electrically conductive paste and the copper foil due to thermal shock during reflow of solder, or the like, thus causing operating faults.

Generally, in a substrate material using organic nonwoven fabric as a reinforcing material, the capacity of the reinforcing material to prevent fluidization of the impregnating resin during thermal pressing is greater than in a substrate material using glass cloth as a reinforcing material. Therefore, the pressure applied during thermal pressing must be increased in order that pores in the substrate material are eliminated and the impregnating resin of substrate material fills in between wiring patterns (this is a problem in a multilayer substrate), and hence the aforementioned problems arise due to uncured impregnating resin (thermosetting resin) flowing in between the electroconductive paste and the copper foil during the thermal pressing stage.

Furthermore, substrate materials using nonwoven fabric, be it organic or inorganic nonwoven fabric, are generally subject to significant bowing. This is because the nonwoven fabric forming the reinforcing material is fabricated as a layer of short, cut fibers, like paper, and therefore it is difficult to control the direction of the fibers (fiber orientation) and a partially uneven fiber orientation is liable to occur. Consequently, the properties of the material, namely, its thermal expansivity, elasticity, and the like, vary in different directions, according to the fiber orientation, and when substrate materials having different properties in each direction are stacked in multiple layers, this appears in the form of bowing and twisting of the material. For this reason, currently, PCB's using only nonwoven fabric are rare, whilst PCB's which additionally use woven cloth in some layers are more common.

SUMMARY OF THE INVENTION

The present invention was devised in order to resolve the conventional problems described above, its object being to provide a highly reliable PCB subject to little bowing or twisting in the substrate, wherein the substrate and metal wiring are firmly bonded together, and an electroconductive paste filled into through holes is stably connected, electrically and mechanically, to the metal wiring, and to provide a method of manufacture for same.

In the PCB relating to the present invention, through holes are formed in the thickness direction of a sheet substrate consisting of resin component layers containing an inorganic insulating filler formed onto both sides of an organic nonwoven fabric, an electroconductive resin component is filled into the through holes, and a wiring pattern, a portion of which is electrically connected to the electroconductive resin component, is formed onto both sides of the sheet substrate.

Furthermore, the PCB relating to the present invention comprises a plurality of sheet substrates consisting of resin component layers containing an inorganic insulating filler formed onto both sides of an organic nonwoven fabric, and two or more electrode layers, and it has a structure whereby through holes are formed in the sheet substrates in the thickness direction thereof and an electroconductive resin component is filled into the through holes, forming an electrical connection with each electrode layer.

In the aforementioned composition, it is desirable if the inorganic insulating filler is at least one item selected from $Al_2O_3$, $MgO$, $SiC$, $SiO_2$, and $AlN$ powder.

In the aforementioned composition, it is desirable if the content of inorganic filler in the resin component layer is 20 wt% or above.

In the aforementioned composition, it is desirable if the inorganic filler in the resin component layer is a hydroxide.

In the aforementioned composition, it is desirable if the hydroxide composing the inorganic filler is at least one material selected from $Al(OH)_3$, $Al_2O_3 \cdot 3H_2O$, $Ba(OH)_2$ and $Mg(OH)_2$.

In the aforementioned composition, it is desirable if the resin forming the resin component layer containing an inorganic filler is a thermosetting resin.

In the aforementioned composition, it is desirable if the thermosetting resin is at least one resin selected from an epoxy resin, thermosetting polybutadiene resin, phenol resin or polyimide resin.

In the aforementioned composition, it is desirable if the organic nonwoven fabric material in the substrate is a heat-resistant synthetic fiber.

In the aforementioned composition, it is desirable if the organic nonwoven fabric material has a density of 0.8 g/cm$^3$ or above.

In the aforementioned composition, it is desirable if the heat-resistant synthetic fiber has an aromatic polyamide as its principal component.

In the aforementioned composition, it is desirable if the content of metal particles in the electroconductive resin component is in the range of 80–92.5 wt%.

In the aforementioned composition, it is desirable if the metal particles are at least one type of metal-particle selected from gold, silver, palladium, copper, nickel, tin and lead.

Furthermore, in a method of manufacturing a PCB relating to the present invention, a sheet base material consisting of uncured thermosetting resin component layers containing an inorganic insulating filler formed onto both sides of an organic nonwoven fabric is prepared, and a cover film is bonded onto both sides of the sheet material, whereupon through holes are formed in this sheet substrate material in the thickness direction thereof, an electroconductive paste is filled into these through holes, and the cover film is then removed, metal foil is applied to both sides of the substrate material, and the substrate material is heated and pressurized to cure the thermosetting resin, thereby causing the metal foil to adhere to the resin component layer, whereupon the metal foil is subjected to patterning in a prescribed pattern.

In a further method of manufacturing a PCB relating to the present invention, a sheet base material consisting of uncured thermosetting resin component layers containing an inorganic insulating filler formed onto both sides of an organic nonwoven fabric is prepared, and a cover film is bonded onto both sides of the sheet base material to obtain a sheet substrate material, whereupon through holes are formed in this sheet substrate material in the thickness direction thereof, an electroconductive paste is filled into these through holes, and the cover film is then removed to form an intermediate substrate of the aforementioned substrate material, whereupon a second of these intermediate substrates is prepared, a circuit board having at least two layers of wiring pattern is inserted between these substrates, two layers of metal foil are arranged respectively on the outer sides thereof, and the whole entity is heated and pressurized to harden the thermosetting resin, whereupon the metal foil is subjected to patterning in a prescribed pattern.

In a further method of manufacturing a PCB relating to the present invention, a sheet base material consisting of uncured thermosetting resin component layers containing an inorganic insulating filler formed onto both sides of an organic nonwoven fabric is prepared, and a cover film is bonded onto both sides of the sheet base material to obtain a sheet substrate material, whereupon through holes are formed in this sheet substrate material in the thickness thereof, an electroconductive paste is filled into these through holes, and the cover film is then removed to form intermediate substrates of the aforementioned substrate material, whereupon the intermediate substrates are inserted respectively between a plurality of double-sided PCB's, the whole object is heated and pressurized to harden the thermosetting resin, and the plurality of double-sided PCB's are joined into a single entity by means of the intermediate substrates.

In the aforementioned composition, it is desirable if the combined thickness of both layers of uncured thermosetting resin component containing an inorganic filler is within the range of 50–300 μm.

In the aforementioned composition, it is desirable if the organic nonwoven fabric has a density of 0.8 g/cm$^3$ or above.

In the aforementioned composition, it is desirable if the temperature during heating and pressurization is in the range of 170°–260° C.

In the aforementioned composition, it is desirable if the applied pressure during heating and pressurization is in the range of 20–80 kg/cm$^2$.

In the aforementioned composition, it is desirable if the thermosetting resin and the resin forming one component of the electroconductive paste are essentially thermosetting resins of the same resin type.

In the aforementioned composition, it is desirable if the inorganic insulating filler is at least one material selected from $Al_2O_3$, MgO, SiC, $SiO_2$ and AlN powder.

In the aforementioned composition, it is desirable if the inorganic filler in the resin component layer is a hydroxide.

In the aforementioned composition, the hydroxide composing the inorganic filler is at least one material selected from $Al(OH)_3$, $Al_2O_3 \cdot 3H_2O$, $Ba(OH)_2$ or $Mg(OH)_2$.

In the aforementioned composition, it is desirable if the content of inorganic filler in the resin component layer is 20 wt% or more.

In the aforementioned composition, it is desirable if the thermosetting resin is at least one resin selected from an epoxy resin, thermosetting polybutadiene resin, phenol resin, and polyimide resin.

In the aforementioned composition, it is desirable if the organic nonwoven fabric material in the substrate is a heat-resistant synthetic fiber.

In the aforementioned composition, it is desirable if the heat-resistant synthetic fiber has an aromatic polyamide as its principal component.

In the aforementioned composition, it is desirable if the content of metal particles in the electroconductive resin component is in the range of 80–92.5 wt%.

In the aforementioned composition, it is desirable if the metal particles are at least one type of metal particle selected from gold, silver, palladium, copper, nickel, tin and lead.

In the aforementioned composition, it is desirable if the through holes are formed by at least one means selected from drilling, carbon dioxide laser, YAG laser, and excimer laser.

According to the composition of the PCB of the present invention described above, by comprising a plurality of sheet substrates consisting of resin component layers containing an inorganic insulating filler formed onto both sides of an organic nonwoven fabric of 0.8 g/cm³ density or above, and by adopting a structure whereby through holes are formed in the sheet substrates in the thickness direction thereof, and an electroconductive resin component is filled into the through holes, forming an electrical connection with each electrode layer, it is possible to produce a highly reliable PCB, wherein wiring patterns are firmly bonded to the insulating resin without being affected by organic nonwoven fabric in the substrate, and moreover, the wiring patterns and electroconductive resin component are stably connected, electrically and mechanically.

Furthermore, since an insulating resin component layer containing an inorganic filler is formed between the wiring pattern and the organic nonwoven fabric, the reliability of the insulation between the wiring patterns, and in particular, the migration properties and electrical insulating properties therebetween, are greatly improved compared to conventional PCB's.

Furthermore, by using a substrate material, containing organic nonwoven fabric as a reinforcing material, which has been compressed to a high density, it is possible to eliminate anisotropy in the elasticity of the nonwoven fabric surface, and a substrate which is subject to little bowing or twisting can be produced.

In a desirable example of the composition described above, if the inorganic insulating filler is one material selected from $Al_2O_3$, MgO, SiC, $SiO_2$ and AlN powder, and the content of the inorganic filler is 20 wt% or more, then the thermal expansivity of the substrate can be controlled and a PCB having excellent thermal conductivity is obtained.

In a desirable example of the composition described above, if the resin comprising the resin component layer containing an inorganic filler is a thermosetting resin, then the bonding strength between the substrate, the insulating resin layer and the electroconductive resin component will be high, and a PCB having excellent thermal resistance and even higher reliability is obtained.

In a desirable example of the composition described above, if a hydroxide (for example, $Al(OH)_3$, $Al_2O_3 \cdot 3H_2O$, $Ba(OH)_2$, $Mg(OH)_2$) is added to the thermosetting epoxy resin, crystallized water contained in the hydroxide reacts to dissociate itself at or over 200° C., concurrently causing the resin to show an endothermic reaction, thereby rendering the material of the insulating layer to be flame-resistant.

In a desirable example of the composition described above, if the thermosetting resin is one resin selected from epoxy resin, thermosetting polybutadiene resin, phenol resin, and polyimide resin, excellent practicality in terms of thermal resistance is obtained.

In a desirable example of the composition described above, if the organic nonwoven fabric in the substrate comprises heat-resistant synthetic fibers, then excellent thermal resistance is obtained.

In a desirable example of the composition described above, if the organic nonwoven fabric in the substrate has an aromatic polyamide as its main component, then excellent thermal resistance is obtained.

In a desirable example of the composition described above, if the metal particles are at least one type of metal particle selected from gold, silver, palladium, copper, nickel, tin, and lead, then the contact resistance between the electroconductive resin component and the wiring patterns will below, and good electrical conductivity can be maintained therebetween.

Moreover, according to the method of manufacturing a PCB according to the present invention, it is possible to manufacture a highly reliable PCB as described above by means of simple and rational steps, whereby a sheet base material consisting of uncured thermosetting resin component layers containing an inorganic insulating filler formed onto both sides of an organic nonwoven fabric of 0.8 g/cm³ density or above is prepared, and a cover film is bonded onto both sides of the sheet material, whereupon through holes are formed in this sheet substrate material in the thickness direction thereof, an electroconductive paste is filled into these through holes, and the cover film is then removed, metal foil is applied to both sides of the substrate material, and the substrate material is heated and pressurized to harden the thermosetting resin, thereby causing the metal foil to adhere to the resin component layer, whereupon the metal foil is subjected to patterning in a prescribed pattern.

According to a further method of manufacturing a PCB according to the present invention, it is possible to manufacture a highly reliable multilayer PCB as described above by means of simple and rational steps, whereby a sheet base material consisting of uncured thermosetting resin component layers containing an inorganic insulating filler formed onto both sides of an organic nonwoven fabric of 0.8 g/cm³ density or above is prepared, and a cover film is bonded onto both sides of the sheet base material to obtain a sheet substrate material, whereupon through holes are formed in this sheet substrate material in the thickness direction thereof, an electroconductive paste is filled into these through holes, and the cover film is then removed to form an intermediate substrate of the aforementioned substrate material, whereupon a second of these intermediate substrates is prepared, a circuit board having at least two layers of wiring pattern is inserted between these substrates, two layers of metal foil are arranged respectively on the outer sides thereof, and the whole entity is heated and pressurized to harden the thermosetting resin, whereupon the metal foil is subjected to patterning in a prescribed pattern.

According to a further method of manufacturing a PCB according to the present invention, it is possible to manufacture a highly reliable multilayer PCB as described above by means of simple and rational steps, whereby a sheet base material consisting of uncured thermosetting resin component layers containing an inorganic insulating filler formed onto both sides of an organic nonwoven fabric of 0.8 g/cm$^3$ density or above is prepared, and a cover film is bonded onto both sides of the sheet base material to obtain a sheet substrate material, whereupon through holes are formed in this sheet substrate material in the thickness thereof, an electroconductive paste is filled into these through holes, and the cover film is then removed to form intermediate substrates of the aforementioned substrate material, whereupon the intermediate substrates are inserted respectively between a plurality of double-sided PCB's, the whole object is heated and pressurized to harden the thermosetting resin, and the plurality of double-sided PCB's are joined into a single entity by means of the intermediate substrates.

In the foregoing, the term "uncured" also includes half-cured resins (B stage state). Furthermore, the initial curing temperature of the thermosetting resin can be changed appropriately by means of on the type or content of the catalyst (curing agent, reaction promoter) with respect to the polyfunctional low molecular compound or the initial condensation reaction intermediate.

In a desirable example of the composition described above, if the thickness of the resin layer consisting of uncured thermosetting resin is in the range of 50–300 µm, then it is possible reliably to prevent the organic nonwoven fabric in the substrate from entering into the interface region with the metal foil during heating and pressurization, and furthermore, it is possible to manufacture the aforementioned highly reliable PCB, wherein there is excellent adhesion of the metal foil, at a good level of manufacturing efficiency. The thickness of the substrate can also be controlled as desired.

In a desirable example of the composition described above, if the temperature during heating and pressurization is in the range of 170°–260° C, then curing of the thermosetting resin can be completed effectively.

In a desirable example of the composition described above, if the applied pressure during heating and pressurization is in the range of 20–80 kg/cm$^2$, then it is possible reliably to improve the bonding strength between the metal foil and resin layers, and between the metal foil and the electroconductive resin component, and a PCB of the aforementioned high reliability can be manufactured at a good level of manufacturing efficiency. It is also possible substantially to eliminate voids in the sheet material, and to improve substrate properties.

In a desirable example of the composition described above, if the through holes are formed by at least one means selected from drilling, carbon dioxide laser, YAG laser or excimer laser, then they can be formed in a high density corresponding to narrow pitching.

DESCRIPTION OF THE PREFERRED EMBODIMENTS

Embodiments of the present invention are described below.

Embodiment 1

FIGS.1A–G are sectional views illustrating manufacturing steps for a double-sided PCB according to Embodiment 1 of the present invention; FIGS.2A–F are sectional step views illustrating manufacturing steps for a multilayer PCB using a double-sided PCB as shown in FIG. 1 and intermediate substrates; FIGS.3A–F are sectional step views illustrating manufacturing steps for a multilayer PCB similarly using double-sided PCB's as shown in FIG. 1 and intermediate substrates.

As shown in FIG. 1 G, the double-sided PCB according to the present embodiment is composed such that a resin component layer (insulating resin layer 101) containing an inorganic filler is pasted onto both sides of an organic nonwoven fabric (sheet material 100) of 0.8 g/cm$^3$ density or above, through holes are formed in a sheet substrate constituted by this inorganic nonwoven fabric and resin component layer, an electroconductive resin component (electroconductive resin paste 104) is filled into the through holes, and electrode layers, namely, wiring patterns (circuit patterns 106), a portion of which is electrically connected to the electroconductive resin component, are pasted onto the insulating resin layers 101 on either side of the sheet material.

Figure 1A:
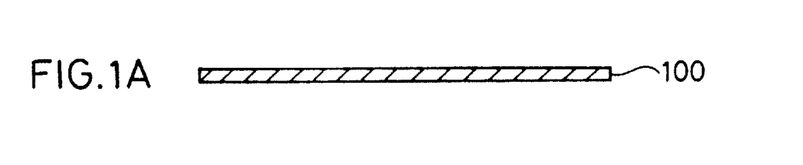
FIGS. 1A–1G comprises sectional views illustrating manufacturing steps for a double-sided PCB according to Embodiment 1.

In a method for manufacturing a double-sided PCB of this kind, a sheet material 100 consisting of organic nonwoven fabric compressed to a thickness of 90 µm was prepared, as shown in FIG. 1A. For this sheet material 100, an nonwoven fabric (density 0.5 g/cm$^3$) of aromatic polyimide (aramid) fibers was used (for example, "Kevlar" made by Du Pont Co.: fineness: 1.5 denier; length: 6.7 mm; weight: 72 g/m$^2$), which was calendered at high temperature in an ultra-high-pressure calendering device to achieve a density of 0.8 g/cm$^3$ or above.

Figure 1B:
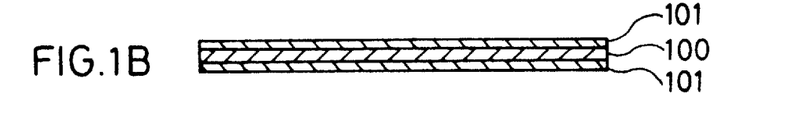

Thereupon, thermosetting epoxy resin (for example, "EPON 1151B60" made by Shell Oil Co.) containing an inorganic filler was applied to both sides of the sheet material 100 to form insulating resin layers 101. In this case, the inorganic filler contained 20 wt% of $Al_2O_3$ powder (for example, alumina powder ALM-41 made by Sumitomo Chemicals Co. Ltd.), or a hydroxide (for example, $Al(OH)_3$, $Al_2O_3 \cdot 3H_2O$, $Ba(OH)_2$ or $Mg(OH)_2$), with respect to the thermosetting epoxy resin, and methylethyl ketone was added as a solvent. One possible method for manufacturing the aforementioned film is to form a coat of liquid material consisting of resin dissolved in a prescribed solvent by means of a doctor blade or coater method, then leaving the solvent to dry. However, in the present embodiment, a film was formed by means of a dye-coater such that there was a coating 50 μm thick after drying on one side of the sheet material 100, and drying was conducted under conditions whereby the thermosetting epoxy resin was in a half-cured state, rather than completely cured. A further insulating resin layer 101 was formed onto the other surface of the sheet material 100.

Figure 1C:
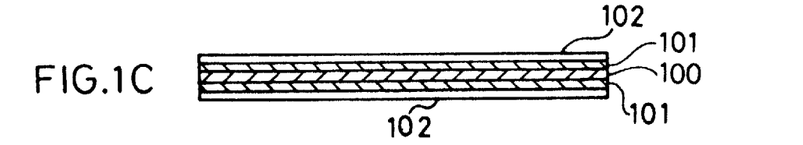

Thereupon, as shown in FIG. 1C, a 12 μm-thick cover film 102 of polyethylene terephthalate, or the like, was laminated onto the surface of these insulating resin layers 101 by heating and pressurization at a lower temperature than the initial setting temperature of the aforementioned thermosetting resin.

Figure 1D:
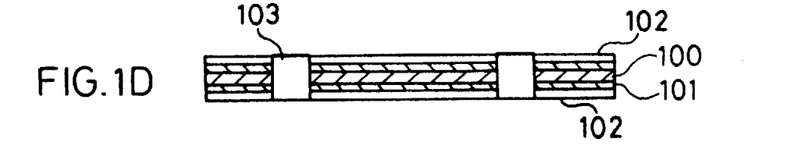
Figure 1E:
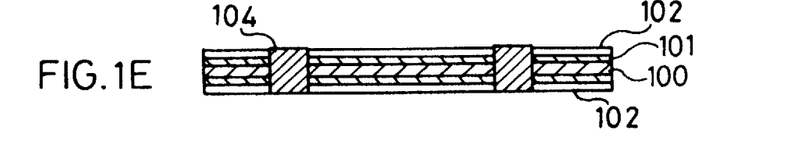

Thereupon, as shown in FIG. 1D, 200 μm-diameter through holes 103 were formed in desired positions on the base material laminated with this cover film 102, by means of laser processing using carbon dioxide laser, excimer laser, or the like, for example.

Thereupon, as shown in FIG. 1 E, electroconductive resin paste 104 was filled into the through holes 103. Here, the electroconductive resin paste 104 comprised copper powder of average particle size 2 μm as an electroconductive material, and insoluble epoxy resin as a binder resin. The copper powder content was 85 wt% and the paste 104 was prepared by kneading the copper powder and binder resin together in a three-drum roller. In order to fill the electroconductive resin paste 104, the base material 100 containing the through holes 103 was positioned on the table of a printing machine (omitted from diagram), and the electroconductive resin paste 104 was printed thereonto from above the cover film 102. The printing method used may be roll transfer printing, for example. In this, the cover film 102 on the upper side acts as a printing mask, and also serves to prevent surface contamination of the insulating resin layer 101.

Figure 1F:
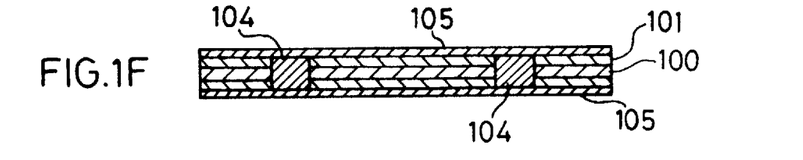

Next, the protective film 102 was removed from the surface of the insulating resin layers 101, whereupon 18 μm thick copper foil 105 was applied to the surface of the insulating resin layers 101. By heating and pressurization of the board in this state, as shown in FIG. 1F, the insulating resin layer 101 consisting of thermosetting resin and inorganic filler also hardens, and the resin layers 101 and copper foil 105 bond together. As regards the heat and pressure conditions in this process, the temperature was raised from room temperature to 180° C. over a period of 30 minutes whilst applying a pressure of 60 kgf/cm$^2$ in a vacuum, the temperature was held at 180° C. for 60 minutes, and it was then reduced to room temperature over 30 minutes. In this case, the copper foil 105 bonded securely to the hardened resin layers 101, without being affected by aromatic polyamide (aramid) fibers in the sheet base material 100.

This process also caused the thermosetting resin in the electroconductive resin paste 104 to harden, and this consolidated the bond between the electrical material in the electroconductive resin paste. The presence of voids in the sheet base material 100 made of organic nonwoven fabric was reduced to 0–1 vol.% by the heating and pressurization process, and any voids were reduced in size. Also, the hardening of the binder component in the electroconductive resin paste 104 which had permeated the sheet base material 100 meant that secure bonding was achieved at the interface between the electroconductive resin paste 104 and sheet base material 100.

Figure 1G:
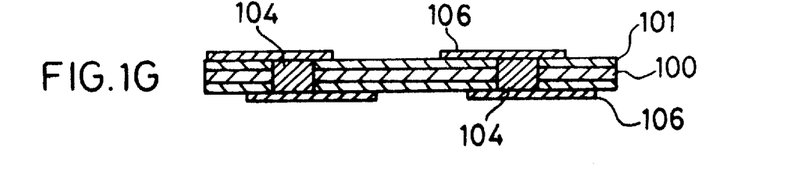

Finally, as shown in FIG. 1G, circuit patterns 106 were formed in the copper foil 105 by means of a standard etching process. It was possible to manufacture a double-sided PCB by means of the above method.

Results from various reliability tests conducted on a PCB fabricated in the above manner showed the connective resistance between layers to be 3.3 mΩ per via, when measured by a 4-terminal method. The peel strength of the copper foil 105 (circuit pattern 106) was 1.8 (kg/cm width) or above, which is 0.5 (kg/cm width) stronger than a conventional nonwoven base material which does not comprise the insulating resin layers 101 described above. Moreover, the thermal conductivity was found to be 0.9 (w/mK), which is 0.2 (w/mK) better than in a conventional board. The reliability of the connective resistance was evaluated using a circuit comprising 500 vias connected in series, which was subjected to oil-dip testing, solder flow testing and solder reflow testing, and in each case the change in connective resistance was a rise of approximately 0.8 mΩ per via.

In view of the above, the double-sided PCB according to the present embodiment can be regarded as a highly reliable high-density PCB, which contains no through holes and wherein, furthermore, the insulating resin layers and circuit patterns 106 are securely bonded together and the electroconductive resin paste 104 and circuit patterns 106 are stably connected, electrically and mechanically.

Embodiment 2

Figure 2A:
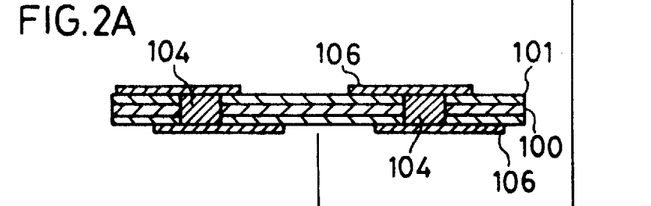
FIGS. 2A–2F comprises sectional step views illustrating manufacturing steps for a multilayer PCB according to Embodiment 2.

FIGS.2A–F are sectional step views illustrating manufacturing steps for a multilayer PCB according to Embodiment 2 of the present invention. In the drawings, FIGS.2B and C show a PCB obtained by stripping the cover film 102 from a base material in the state shown in FIG. 1E in Embodiment 1 described above, (hereinafter, called 'intermediate substrate',) and FIG. 2A is a double-sided PCB obtained by means of Embodiment 1 described above.

Below, manufacturing steps are described on the basis of FIG. 2.

Firstly, a double-sided PCB (FIG. 1A) was prepared by means of the steps shown in FIG. 1A–G according to Embodiment 1 described above. Thereupon, two intermediate substrates (FIGS.2B and C) obtained by implementing the steps shown in FIG. 1–E and then stripping off the cover film 102 were prepared, separately from the aforementioned double-sided PCB. Next, as shown in FIG. 2D, these intermediate substrates were placed in registered positions respectively above and below the double-sided PCB (FIG. 2A), and copper foil 205 was laid respectively thereover.

Figure 2B:
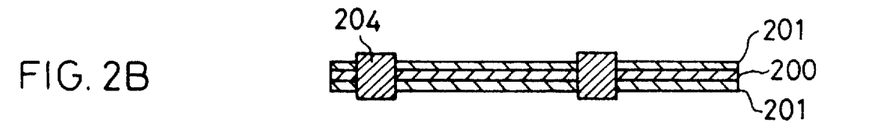
Figure 2C:
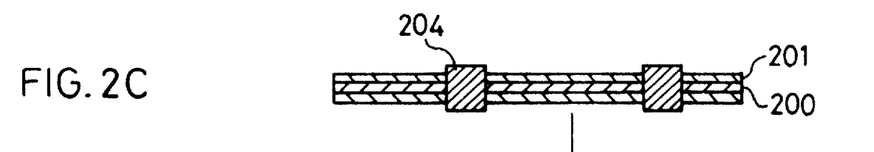
Figure 2D:
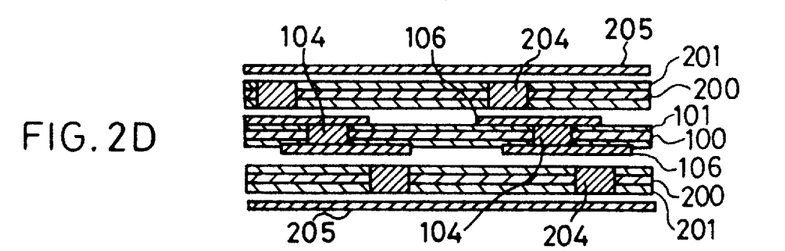
Figure 2E:
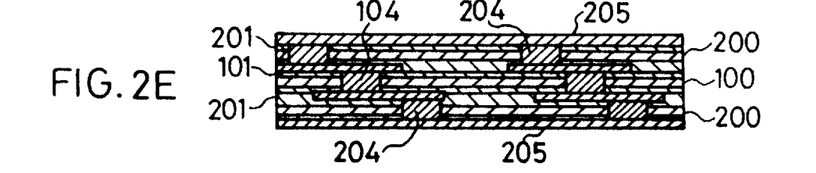

As illustrated in FIG. 2E, the laminate of registered layers obtained by these steps was heated and pressurized, causing the double-sided PCB to bond with the copper foil 205 via the intermediate substrates shown in FIGS.2B and C.

Figure 2F:
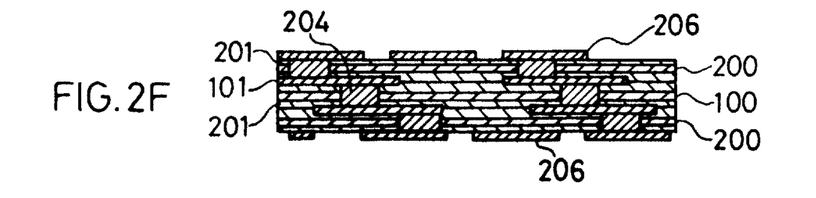

As illustrated in FIG. 2F, circuit patterns 206 were formed respectively in the copper foil 205 on both sides by means of etching using a standard patterning method. Thereby, a four-layer multilayer PCB was obtained.

Results from various reliability tests conducted on the four-layer PCB fabricated in the above manner showed the connective resistance between the respective layers to be 1.2 mΩ per via, when measured by a 4-terminal method. The reliability of the connective resistance was evaluated using a circuit comprising 500 vias connected in series, which was subjected to oil-dip testing, solder flow testing and solder reflow testing, and in each case the change in connective resistance was a rise of approximately 0.4 mΩ per via.

From the test results given above, the multilayer PCB according to the present embodiment can be regarded as a highly reliable high-density PCB, which contains no through holes and wherein, furthermore, the insulating resin layers and circuit patterns are securely bonded together and the electroconductive resin paste and circuit patterns are stably connected, electrically and mechanically.

Furthermore, the steps described above are for obtaining a four-layer PCB, but by using a multilayer PCB (FIG. 2F) in place of the double-sided PCB in FIG. 2A, and forming a laminate by repeating the steps in FIGS.2A–F, a six-layer board can be obtained.

Embodiment 3

Figures 3A, 3B, 3C:
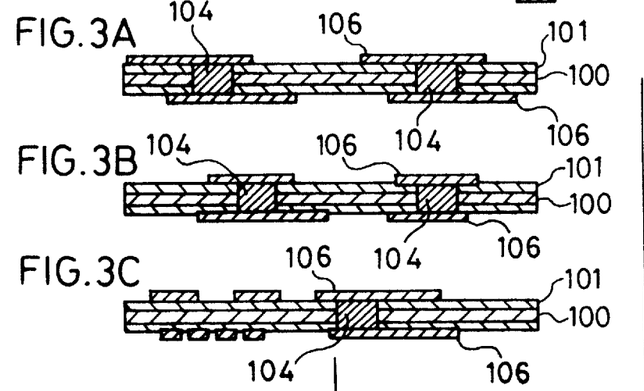
FIGS. 3A–3G comprises sectional step views illustrating manufacturing steps for a multilayer PCB according to Embodiment 3.
Figure 3D:
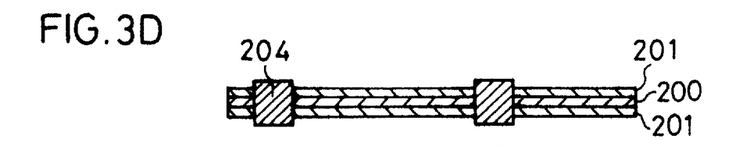
Figure 3E:
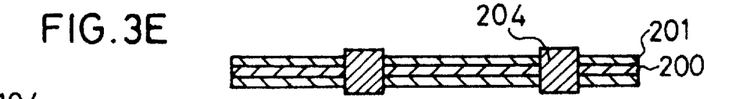

FIGS.3A–G are sectional step views showing manufacturing steps for a multilayer PCB according to Embodiment 3 of the present invention. In the drawings, FIGS.3D and E show a substrate obtained by stripping the cover film 102 from a base material in the state shown in FIG. 1E in Embodiment 1 described above (hereinafter, called 'intermediate substrate',) and FIGS.3A–C show double-sided PCB's obtained by means of Embodiment 1.

Below, manufacturing steps are described on the basis of FIG. 3.

Figure 3F:
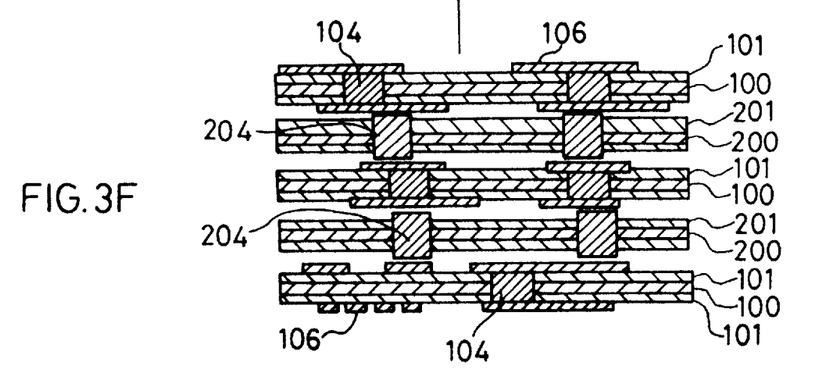

The double-sided PCB's and intermediate substrates were prepared in a similar manner to Embodiment 2, and as shown in FIG. 3(f), the intermediate substrates (FIGS.3D and E) were placed respectively in registered positions between the double-sided PCB's (FIGS.3A, B and C), and superposed respectively on each other.

Figure 3G:
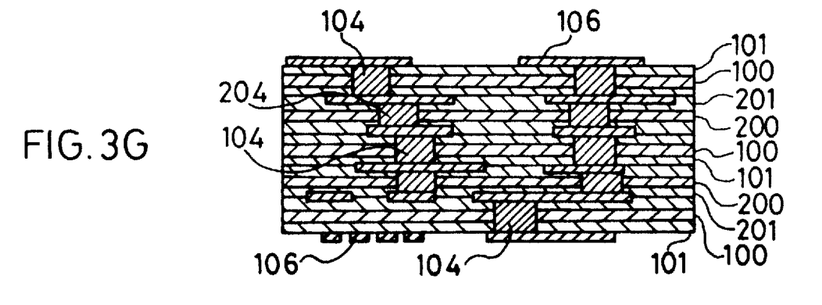

Thereupon, as shown in FIG. 3G, the laminate of registered layers obtained by the steps above was heated and pressurized, causing the double-sided PCB's to bond together via the intermediate substrates. Thereby, it was possible to obtain a mutlilayer PCB having a total of 6 wiring layers.

Results from various reliability tests conducted on the six-layer PCB fabricated in the above manner showed the connective resistance between the respective layers to be 2.2 mΩ per via, when measured by a 4-terminal method. The reliability of the connective resistance was evaluated using a circuit comprising 500 vias connected in series, which was subjected to oil-dip testing, solder flow testing and solder reflow testing, and in each case the change in connective resistance was a rise of approximately 0.3 mΩ per via.

From the test results given above, the multilayer PCB according to the present embodiment can be regarded as a highly reliable high-density PCB, which contains no through holes and wherein, furthermore, the insulating substrates and circuit patterns are securely bonded together and the electroconductive resin paste and circuit patterns are stably connected, electrically and mechanically.

Furthermore, in the case of Embodiment 3, it is possible to fabricate a PCB having a higher number of wiring layers by using four-layer PCB's in place of the double-sided PCB's. Furthermore, depending on the lamination conditions, it is also possible to bury the outermost wiring layers 106 in the aforementioned insulating resin layers 101 by means of heating and pressurization, and it is also possible to obtain a board having a smooth outermost surface.

In Embodiment 1, Embodiment 2 and Embodiment 3 above, a sheet base material comprising heat-resistant aromatic polyamide fibers as a reinforcing material is used, but in the present invention, it is also possible to use a sheet base material comprising heat-resistant synthetic fibers other than polyamide fibers, or the like, as a reinforcing material.

Furthermore, although epoxy resin was used as the thermosetting resin, in the present invention, in addition to epoxy resin, it is also possible to use a resin consisting of one or more of the following: epoxy resin, polybutadiene resin, phenol resin and polyimide resin.

Furthermore, although copper particles were used as the electroconductive material in the electroconductive resin paste, in the present invention, in addition to copper particles, it is also possible to use metal particles consisting of one or more of the following: copper, silver, gold, palladium, tin, lead and nickel.

Furthermore, although a carbon dioxide gas laser was used for forming the holes, in the present invention, in addition to a carbon dioxide gas laser, it is also possible to use at least one laser light selected from a carbon dioxide gas laser, YAG laser and excimer laser, and it is also possible to use drill processing.

In Embodiment 1, Embodiment 2 and Embodiment 3 described above, an organic nonwoven fabric of 0.8 g/cm$^3$ density or above was used. However, when an nonwoven fabric of 0.5–0.7 g/cm$^3$ density was used, its strength in terms of elasticity was only 50 kg/mm$^2$, and as a result only a substrate producing significant bowing and twisting could be obtained. At densities of 0.75 g/m$^3$ and 0.8 g/cm$^3$ or above, elasticity figures of 100 kg/mm$^2$ and 200 kg/mm$^2$ were obtained, respectively, and at a density of 0.8 g/cm$^3$ or above, a satisfactory substrate producing little bowing or twisting was obtained.

In Embodiment 1, Embodiment 2 and Embodiment 3 described above, $Al_2O_3$ powder was used as an inorganic filler added to the insulating resin component layer, but it is also possible to use $Al_2O_3$, $MgO$, $SiO_2$, or the like, to control thermal expansivity according to the semiconductor device application, and if thermal conductivity is a requirement, then similarly, $Al_2O_3$, $SiC$ or $AlN$ powder, or a hydroxide, or the like, should be used. As a hydroxide (for example, $Al(OH)_3$, $Al_2O_3 \cdot 3H_2O$, $Ba(OH)_2$, $Mg(OH)_2$) is added to the thermosetting epoxy resin, crystallized water of the hydroxide reacts to dissociate itself at or over 200° C., concurrently causing the resin to show an endothermic reaction, thereby rendering the material of the insulating layer to be flame-resistant.

Due to the composition described above, the bonding strength between the insulating resin component layers and the wiring patterns is raised, in addition to which good electrical and mechanical connection is achieved between the wiring patterns and the electroconductive resin paste. As a result, it is possible to produce a highly reliable PCB having excellent durability and electrical properties. Moreover, it is also possible to produce a PCB which is subject to little substrate bowing or twisting, by using a high-density organic nonwoven fabric.

What is claimed is:

1. A printed circuit board characterized in that
through holes are formed in the thickness direction of a sheet substrate consisting of resin component layers containing an inorganic insulating filler pasted onto the surfaces of both sides of an organic nonwoven fabric;
an electroconductive resin component is filled into the through holes in said sheet substrate;
and a wiring pattern, a portion of which is electrically connected to the electroconductive resin component, is formed onto both sides of said sheet substrate.

2. A printed circuit board characterized in that it comprises:
a plurality of sheet substrates consisting of resin component layers containing an inorganic insulating filler formed onto the surface of both sides of an organic nonwoven fabric, and two or more electrode layers; and it has a multilayer wiring structure whereby through holes are formed in each sheet substrates in the thickness direction thereof and an electroconductive resin component is filled into the through holes, forming an electrical connection with each electrode layer.

3. A printed circuit board according to claim 1 wherein the inorganic insulating filler is selected from $Al_2O_3$, MgO, SiC, $SiO_2$, or AlN powder.

4. A printed circuit board according to claim 1 wherein the content of inorganic filler in the resin component layer is 20 wt% or above.

5. A printed circuit board according to claim 1 wherein the inorganic filler in the resin component layer is a hydroxide.

6. A printed circuit board according to claim 5, wherein the inorganic filler in the resin component layer is selected from $Al(OH)_3$, $Al_2O_3 \cdot 3H_2O$, $Ba(OH)_2$ or $Mg(OH)_2$.

7. A printed circuit board according to claim 1 wherein the resin forming the resin component layer containing an inorganic filler is a thermosetting resin.

8. A printed circuit board according to claim 7, wherein the thermosetting resin is at least one resin selected from an epoxy resin, thermosetting polybutadiene resin, phenol resin or polyimide resin.

9. A printed circuit board according to claim 1 wherein the organic nonwoven fabric material in the substrate is a heat-resistant synthetic fiber.

10. A printed circuit board according to claim 1 wherein the organic nonwoven fabric material has a density of 0.8 $g/cm^3$ or above.

11. A printed circuit board according to claim 9, wherein the heat-resistant synthetic fiber has an aromatic polyamide as its principal component.

12. A printed circuit board according to claim 1 wherein the content of metal particles in the electroconductive resin component is in the range of 80–92.5 wt%.

13. A printed circuit board according to claim 12, wherein the metal particles are selected from gold, silver, palladium, copper, nickel, tin or lead.

14. A method of manufacturing a printed circuit board characterized in that a sheet base material consisting of uncured thermosetting resin component layers containing an inorganic insulating filler formed onto the surfaces of both sides of an organic nonwoven fabric is prepared;

a cover film is bonded onto both sides of said sheet material, whereupon through holes are formed in this sheet substrate material in the thickness direction thereof;

an electroconductive paste is filled into these through holes;

said cover film is then removed and metal foil is applied to both sides of said sheet substrate material;

the sheet substrate material is then heated and pressurized to harden said thermosetting resin, thereby causing said metal foil to adhere to said resin component layer; and said metal foil is subjected to patterning in a prescribed pattern.

15. A method of manufacturing a printed circuit board characterized in that a sheet base material consisting of uncured thermosetting resin component layers containing an inorganic insulating filler formed onto the surfaces of both sides of an organic nonwoven fabric is prepared;

a cover film is bonded onto both sides of said sheet material to obtain a sheet substrate material, whereupon through holes are formed in this sheet substrate material in the thickness direction thereof;

an electroconductive paste is filled into these through holes;

said cover film is then removed to form an intermediate substrate of said substrate material;

a second of these intermediate substrates is prepared, and a circuit board having at least two layers of wiring pattern is inserted between these substrates;

two layers of metal foil are arranged respectively on the outer sides thereof;

the whole entity is heated and pressurized to set the thermosetting resin; and the metal foil is subjected to patterning in a prescribed pattern.

16. A method of manufacturing a printed circuit board characterized in that a sheet base material consisting of uncured thermosetting resin component layers containing an inorganic insulating filler formed onto the surfaces of both sides of an organic nonwoven fabric is prepared;

a cover film is bonded onto both sides of said sheet material to obtain a sheet substrate material, whereupon through holes are formed in this sheet substrate material in the thickness direction thereof;

an electroconductive paste is filled into these through holes;

said cover film is then removed to form intermediate substrates of said substrate material;

said intermediate substrates are inserted respectively between a plurality of double-sided printed circuit boards;

the whole object is heated and pressurized to set said thermosetting resin, and said plurality of double-sided printed circuit boards are joined into a single entity by means of said intermediate substrates.

17. A method of manufacturing a printed circuit board according to claim 14, wherein the combined thickness of the layers of uncured thermosetting resin component containing an inorganic filler is within the range of 50–300 $\mu$m.

18. A method of manufacturing a printed circuit board according to claim 14, wherein the organic nonwoven fabric material has a density of 0.8 $g/cm^3$ or above.

19. A method of manufacturing a printed circuit board according to claim 14, wherein the temperature during heating and pressurization is in the range of 170°–260° C.

20. A method of manufacturing a printed circuit board according to claim 14, wherein the applied pressure during heating and pressurization is in the range of 20–80 $kg/cm^2$.

21. A method of manufacturing a printed circuit board according to claim 14, wherein the thermosetting resin and the resin forming one component of the electroconductive paste are the same.

22. A method of manufacturing a printed circuit board according to claim 14, wherein the inorganic insulating filler is at least one material selected from $Al_2O_3$, MgO, SiC, $SiO_2$ or AlN powder.

23. A method of manufacturing a printed circuit board according to claim 14 wherein the inorganic filler in the resin component layer is a hydroxide.

24. A method of manufacturing a printed circuit board according claim 23, wherein the inorganic filler in the resin component layer is at least one item selected from $Al(OH)_3$, $Al_2O_3 \cdot 3H_2O$, $Ba(OH)_2$ or $Mg(OH)_2$.

25. A method of manufacturing a printed circuit board according to claims 14, wherein the content of inorganic filler in the resin component layer is 20 wt% or more.

26. A method of manufacturing a printed circuit board according to claim 14, wherein the thermosetting resin is at least one resin selected from an epoxy resin, thermosetting polybutadiene resin, phenol resin or polyimide resin.

27. A method of manufacturing a printed circuit board according to claim 14, wherein the organic nonwoven fabric material in the substrate is a heat-resistant synthetic fiber.

28. A method of manufacturing a printed circuit board according to claim 27, wherein the heat-resistant synthetic fiber has an aromatic polyamide as its principal component.

29. A method of manufacturing a printed circuit board according to claim 14, wherein the content of metal particles in the electroconductive resin component is in the range of 80–92.5 wt%.

30. A method of manufacturing a printed circuit board according to claim 29, wherein the metal particles are selected from gold, silver, palladium, copper, nickel, tin or lead.

31. A method of manufacturing a printed circuit board according to claim 14, wherein the through holes are formed by at least one means selected from drilling, a carbon dioxide laser, YAG laser, or excimer laser.

* * * * *